United States Patent [19]

Obara

[11] Patent Number: 4,875,189

[45] Date of Patent: Oct. 17, 1989

[54] RANDOM ACCESS MEMORY DEVICE WITH NIBBLE MODE OPERATION

[75] Inventor: Takashi Obara, Tokyo, Japan

[73] Assignee: NEC Corporation, Tokyo, Japan

[21] Appl. No.: 149,282

[22] Filed: Jan. 28, 1988

[30] Foreign Application Priority Data

Jan. 28, 1987 [JP] Japan .................................. 62-19293

[51] Int. Cl.$^4$ ................................................ G11C 8/00

[52] U.S. Cl. ............................. 365/189.04; 365/238.5

[58] Field of Search ............ 365/189, 230, 233, 238.5, 365/189.04

[56] References Cited

U.S. PATENT DOCUMENTS 4,719,602 1/1988 Hag et al. ........................... 365/230

*Primary Examiner*—Joseph A. Popek

*Attorney, Agent, or Firm*—Sughrue, Mion, Zinn, Macpeak & Seas

[57] ABSTRACT

For improving controllability and simplifying the circuit arrangement, there is disclosed a random access memory device comprising a nibble decoder circuit operative to control nibble switching transistors and a read/write control circuit operative to control read/write switching circuits and data amplifier circuits independent from the nibble decoder circuit, and three data bits read out from memory cell arrays are transferred to the same memory cell arrays when a new data bit is written into the a memory cell of the other memory cell array directly accessed by an external processor, thereby preventing the data bits from destruction.

7 Claims, 5 Drawing Sheets

ROW ADDRESS DEC. FIRST MEMORY CELL ARRAY; S·A·& 'Y' SW.; COLUMN ADDRESS DEC.; S·A·& 'Y' SW.; ROW ADDRESS DEC. SECOND MEMORY CELL ARRAY; ROW ADDRESS DEC. THIRD MEMORY CELL ARRAY; S·A·& 'Y' SW.; COLUMN ADDRESS DEC.; S·A·& 'Y' SW.; ROW ADDRESS DEC. FOURTH MEMORY CELL ARRAY; ADDRESS BUFFER/ INVERTER CIRCUIT; RAS; CAS; TIMING GENERATOR CIRCUIT; NB; TGL; WRITE SW.; READ SW.; WRITE AMP.; READ AMP.; WRITE CONTROL; READ CONTROL; RW; INPUT BUFFER CIRCUIT; NIBBLE DECODER CIRCUIT; OUTPUT BUFFER CIRCUIT

RANDOM ACCESS MEMORY DEVICE WITH NIBBLE MODE OPERATION

FIELD OF THE INVENTION

This invention relates to a random access memory device and, more particularly, to a read/write control circuit for a random access stage and a nibble stage of a write-in mode operation.

BACKGROUND OF THE INVENTION

There is now an increasing interest in the semiconductor industry in high speed memory devices such as a random access memory device with page mode operation or with nibble mode operation. The random access memory device is accessible in page mode operation with successive column address signals under a specified single row address. Namely, when a row address is supplied to the random access memory device, a single row of memory cells is selected for access. Then, column address signals are supplied to the random access memory to specify the memory cells in the selected row of the memory cells. When one of the memory cells is specified by the column address signal, a data bit is read out from the specified memory cell and the data bit is supplied to a sense amplifier circuit for decision of the logic level, then amplifying and placing in an output buffer circuit for transferring to a destination. This means that a time period necessary to access a data bit in the page mode operation is approximately equal to the total of the time periods for decision of the column address, turning on the switching transistor between the column line pair and the data lines, activation of the sense amplifier circuit, amplification and placing in the output buffer circuit. In other words, a data bit is accessible in the page mode operation in a time period without consideration of the row address signal. This results in shrinkage in access time.

Similarly, the nibble mode operation is useful for reduction in access time. In a nibble mode operation, accessible memory cells are limited to four. The first memory cell is specified by the row and column address signals latched in synchronous with the row address strobe signal and the column address signal, respectively. However, the remaining three memory cells are accessible in a predetermined order with applications of the column address strobe signals only. This results in high speed read out operation. In order to realize the high speed nibble mode operation, it is necessary to activate four memory cells having addresses strongly related to one another. For example, the second memory cell may be assigned an address specified by a row address signal identical with the row address signal for the first memory cell and by a column address signal only different in logic level of the most significant bit from that for the first memory cell. In a similar manner, the third memory cell may be assigned an address specified by a row address signal only different in the logic level of the most significant bit from that for the first memory cell and by a column address signal identical with that for the first memory cell. However, the fourth memory cell may have an address specified by a row address signal and a column address signal each only different in the logic level of the most significant bit from that for the first memory cell. When the first memory cell is accessed, the remaining three memory cells are simultaneously activated and the logic level of each data bit preserved therein is determined by the sense amplifier circuit. Then, the data bits are successively read out by toggle operations using the column address strobe signals. In order to realize the toggle operation, the random access memory device is usually provided with a nibble decoder circuit which serves as four-to-one decoder circuit, and the output buffer circuit successively transfers the data bits from the nibble decoder circuit to the destination.

Referring to FIG. 1 of the drawings, a typical example of the random access memory device with the nibble decoder circuit is illustrated. In a read-out operation, an address buffer/inverter circuit 1 allows row and column address decoder circuits to activate four memory cells each selected from each memory cell array 2, 3, 4 or 5, then data bits preserved therein are read out and transferred to respective sense amplifier circuits 6, 7, 8 and 9. The sense amplifier circuits 6, 7, 8 and 9 decide the logic levels of the data bits read out from the four memory cells, respectively, and the four data bits are transferred through respective "Y" switch circuits to read/write switch circuits 10, 11, 12 and 13. A mode selecting signal R/W has been supplied from a timing generator circuit (not shown) to read/write control circuits 14 and 15, so that the read-out switches of the read/write switch circuits 10, 11, 12 and 13 are turned on to transfer the data bits to the data amplifier circuits 16, 17, 18 and 19, respectively. The address buffer/inverter circuit 1 supplies the most significant bits of the row and column address signals and the inverses thereof to nibble decoder circuit 21, so that the nibble decoder circuit 21 allows nibble switching transistors 22, 23, 24 and 25 to successively turn on in synchronous with the column address strobe signals. Then, the four data bits successively pass through the respective nibble switching transistors 22, 23, 24 and 25 and are supplied in succession to the output buffer circuit 26 for serial read-out or nibble mode operation.

On the other hand, when the random access memory device is shifted to the write-in operation in response to the mode selecting signal R/W, the address buffer/inverter circuit 1 allows the row address decoder circuits and the column address decoder circuits to select four memory cells from the memory cell arrays 2, 3, 4 and 5, respectively. A new data bit is supplied from the outside thereof to an input buffer circuit 27, and the nibble decoder circuit 21 allows one of the nibble switching transistors 22, 23, 24 and 25 to turn on based on the most significant bits of the row and column address signals. Then, one of the nibble switching transistors 22, 23, 24 and 25 turns on to transfer the new data bit to the data amplifier circuit 16, 17, 18 or 19. The read/write control circuit 14 and 15 has already selected the write amplifier circuits and the write switches of the read/write switch circuits 10, 11, 12 and 13 on the basis of the mode selecting signal R/W, however the nibble decoder circuit 21 allows only one of the write amplifier circuits accompanied by the selected nibble switching transistor and the write switch associated with the write amplifier circuit on the basis of the most significant bits of the row and column address signals. In this device, the read/write control circuits 14 and 15 are activated upon a write-in operation and a read-out operation, respectively. Then, the new data bit is transferred to the selected write switch and supplied through the "Y" switch circuit to one of the memory cell arrays 2, 3, 4 and 5. This means that the remaining three data amplifier circuits are kept in respective inactive states for preventing the data bits preserved in the unselected memory cells from destruction. Thus, the prior-art random access memory device is expected to have the nibble decoder circuit 21 capable of controlling not only the nibble switching transistors 22 to 25 but also the read/write switch circuits 10 to 13 each accompanied by the data amplifier circuit, and, for this reason, another random access memory device employs a nibble decoder circuit combined with the read/write control circuit. FIG. 2 shows the circuit arrangement of such a random access memory device, and circuits and arrays are respectively denoted by reference numerals used for designating the corresponding circuits and arrays of the random access memory device illustrated in FIG. 1, so that detailed description will be omitted for the sake of simplicity.

However, a problem is encountered in the prior-art random access memory device shown in FIG. 1 in controllability in the write-in mode operation. Namely, the read/write control circuits 14 and 15 controls the read/write switch circuits each accompanied by the data amplifier circuit, and the nibble decoder circuit 21 is expected to control the read/write switch circuits and the data amplifier circuits as well as the nibble switching transistors independent from the read/write control circuits. This results in complicate control or deterioration in controllability.

On the other hand, the prior-art random access memory device shown in FIG. 2 has the nibble decoder circuit 28 combined with the read/write control circuit so that the random access memory device is free from the complicate control but has drawbacks in complicate circuit arrangement of the combined nibble decoder circuit. This results in deterioration in operation speed because of the fact that the combined nibble decoder circuit needs to make all decisions at all times.

Prior art random access memory devices are disclosed by S. Sheffield et al. in "A 100 ns 64K Dynamic RAM using Redundancy Techniques" in the Digest of Technical Papers, ISSCC 81, pages 84 and 85, and by Hiroaki Ikeda in Japanese Patent Application No. 57-187702. However, the nibble decoder circuits of these random access memory devices need to supply decoded control signals to the read/write switch circuits, so that the circuit complexities still remain in the prior-art random access memory devices disclosed in the above documents.

SUMMARY OF THE INVENTION

It is therefore an important object of the present invention to provide a random access memory device which executes the nibble mode operation at a high speed.

It is also an important object of the present invention to provide a random access memory device which has a simple circuit arrangement.

It is another important object of the present invention to provide a random access memory device with improved controllability.

It is still another important object of the present invention to provide a random access memory device which performs a write-in mode operation without destruction of the data bits preserved in the memory cells related to the directly accessed memory cell.

To accomplish these objects, the present invention proposes to share the control of the read/write switching circuits and, accordingly, the data amplifier circuits and the control of the switching circuit between a read/write control circuit and a data control circuit.

In accordance with the present invention, there is provided a random access memory device comprising (a) a plurality of memory cells, (b) a plurality of first data nodes, (c) address means responsive to an address information for selectively establishing information paths between the first data nodes and selected memory cells, (d) a plurality of second data nodes, (e) a plurality of write switches each coupled between one of the first data nodes and one of the second data nodes, (f) a plurality of read switches each coupled between one of the first data nodes and one of the second nodes, (g) a bus line, (h) a plurality of selection switches coupled between the second data nodes and the bus line, (i) a data input circuit for operatively supplying the bus line with an input signal, (j) a data output circuit coupled to the bus line for operatively producing an output signal, (k) a serial selection circuit coupled to the selection switches for serially enabling the selection switches one by one, and (l) a control circuit coupled to the read switches and the write switches for simultaneously enabling the write switches in a write operation and simultaneously enabling the read switches in a read operation.

In one implementation, a random access memory device with a read-out mode operation and a write-in mode operation, the write-in mode operation having a random access stage followed by a simultaneous access stage, may comprise (a) plural memory cell arrays each having a plurality of memory cells arranged in rows and columns, (b) addressing means operative to produce a bit control signal and internal address signals specifying certain memory cells each selected from each memory cell array for the read-out mode operation and the write-in mode operation, one of the certain memory cells being directly specified by a row address signal and a column address signal supplied from an external source, (c) plural read/write switching circuits associated with the plural memory cell arrays, respectively, each of the read/write switching circuits being provided with a write-in switch and a read-out switch which are capable of electrically connecting each of the certain memory cells through the addressing means, (d) plural data amplifier circuits paired with the read/write switching circuits, respectively, each of the data amplifier circuits being provided with a write data amplifier and a read data amplifier which are coupled to the write-in switch and the read-out switch, respectively, (e) a data input buffer circuit supplied with a new data bit from the external source, (f) a data output buffer circuit operative to transfer data bits preserved in the certain memory cells to an external destination in sequence, (g) switching means provided with plural switching transistors having respective conduction paths coupled at one ends thereof to the data amplifier circuits, respectively, and at the other ends thereof to the data input buffer circuit or the data output buffer circuit, (h) a data control circuit responsive to the bit control signal and operative to cause one of the switching transistors to turn on in the write-in mode operation, the data control circuit being further operative to cause the switching transistors to successively turn on in the read-out mode operation, and (i) a read/write control circuit operative to produce first and second activation signals the former of which is supplied to the write-in switches and the write data amplifiers for activation and the latter of which is supplied to the read-out switches and the read data amplifiers, the first activation signal allowing the write-in switch of one of the read/write switching circuit and the write data amplifier of one of the data amplifier circuits to transfer the new data bit to the memory cell directly specified by the row and column address signals in the random access stage, the second activation signal allowing the read-out switches of the read/write switching circuits except for aforesaid one of the read/write switching circuits and the read data amplifiers of the data amplifier circuits except for aforesaid one of the data amplifier circuits to read out the data bits from the certain memory cells except for the certain memory cell directly specified by the row and column address signals in the random access stage, the first activation signal allowing all of the write-in switches and all of the write data amplifiers to write the new data bit and the data bits into certain memory cells.

A random access memory device may further comprise a control circuit operative to produce a stage control signal representative of the random access stage or the simultaneous access stage, and, accordingly, the read/write control circuit may have a write control circuit supplied with the bit control signal and the stage control signal for producing the first activation signal and a read control circuit supplied with the first activation signal and the stage control signal for producing the second activation signal.

The write control circuit may have a plurality of NAND gates each supplied with a part of the bit control signal and the stage control signal, the read control signal may have a plurality of NAND gates each supplied with a part of the first activation signal and the stage control signal. The bit control signal may consist of a plurality of bits including two bits identical in logic level with the most significant bits of the row and column address signals, respectively, and two bits opposite in logic level to the most significant bits of the row and column address signals, respectively.

BRIEF DESCRIPTION OF THE DRAWINGS

The features and advantages of a random access memory device according to the present invention will be more clearly understood from the following description taken in conjunction with the accompanying drawings in which.

DESCRIPTION OF THE PREFERRED EMBODIMENT

Figure 1:
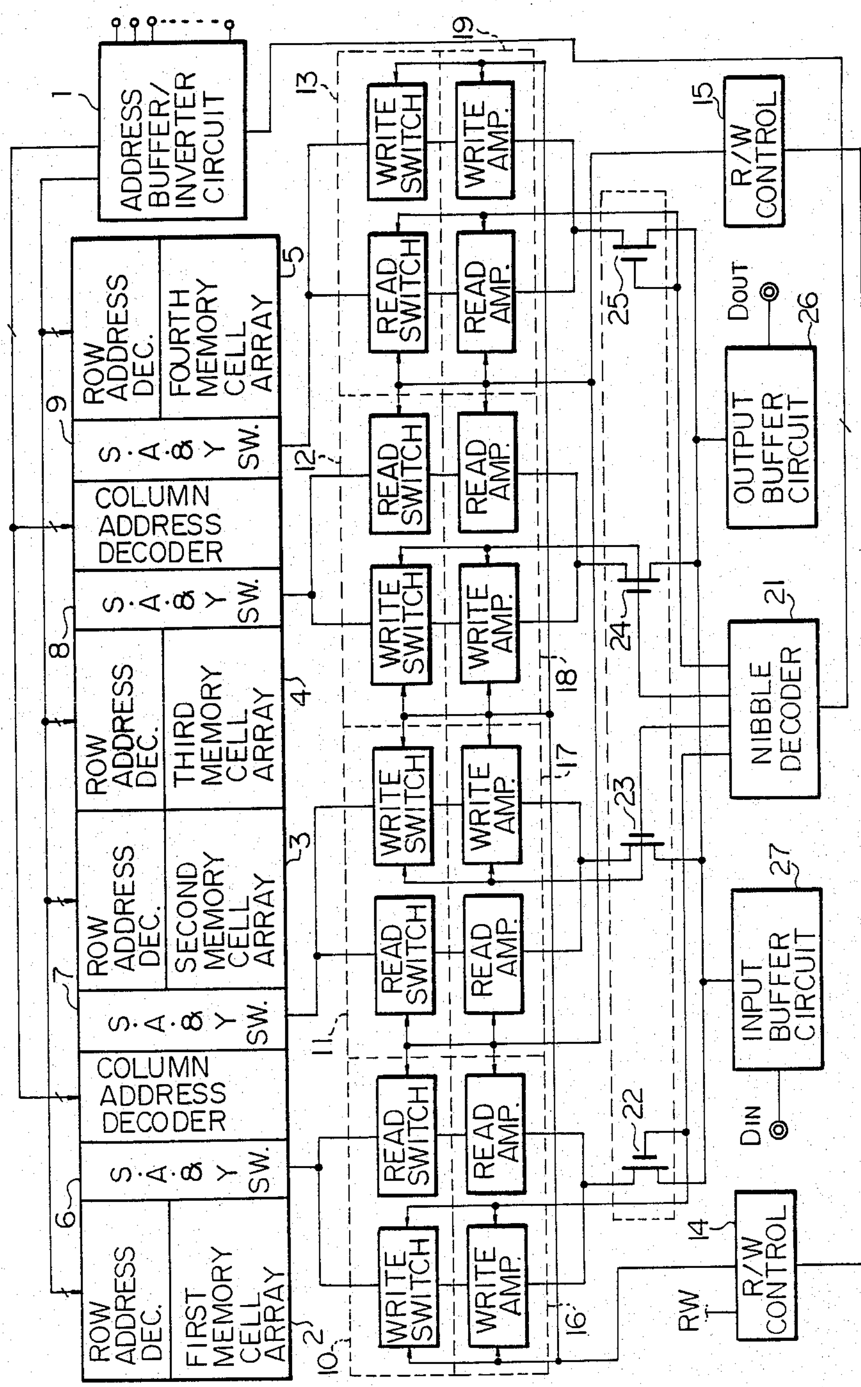
FIG. 1 is a block diagram showing the circuit arrangement of a prior-art random access memory device with nibble mode operation.
Figure 2:
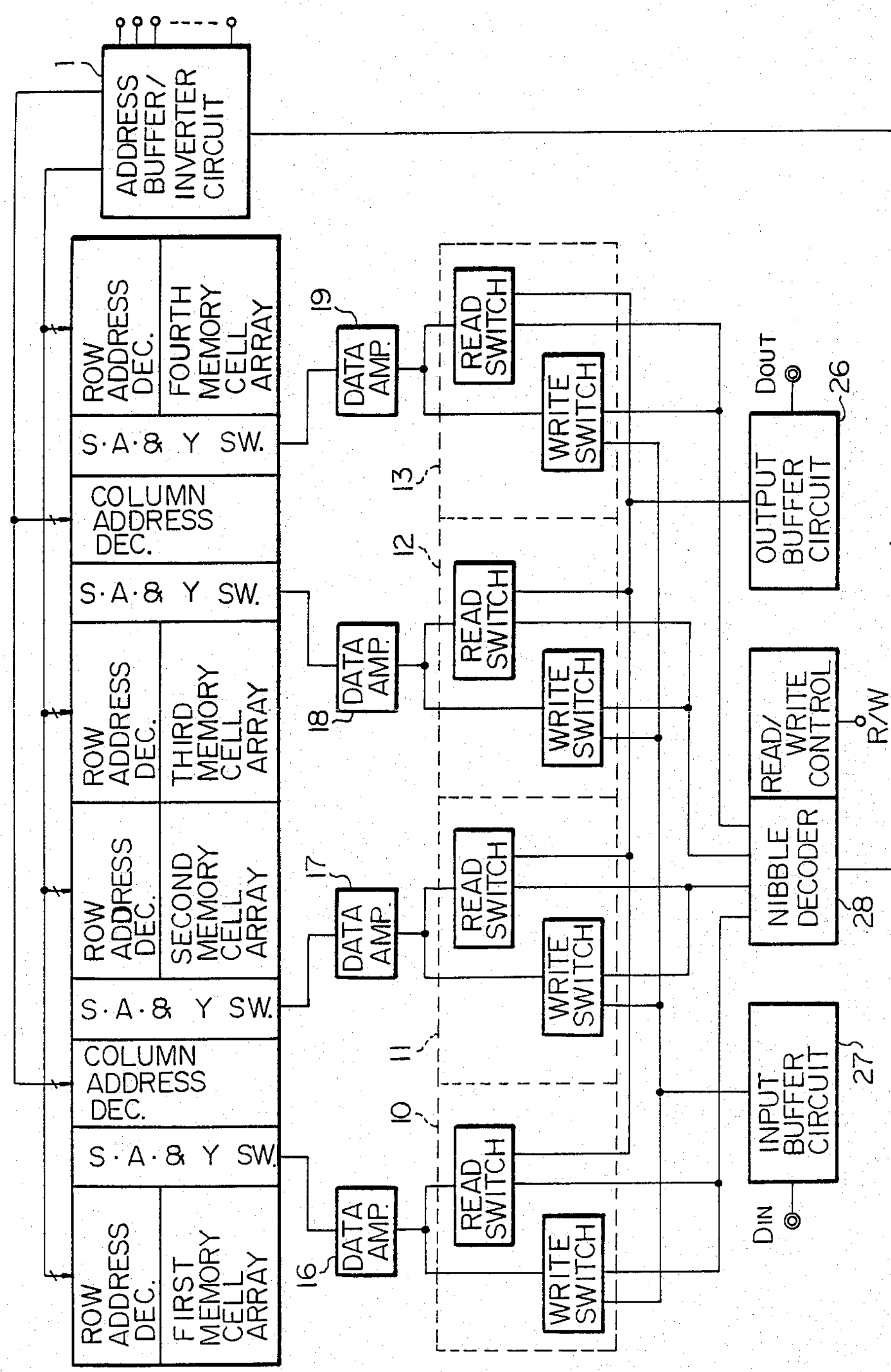
FIG. 2 is a block diagram showing the circuit arrangement of another prior-art random access memory device with nibble mode operation.
Figure 3:
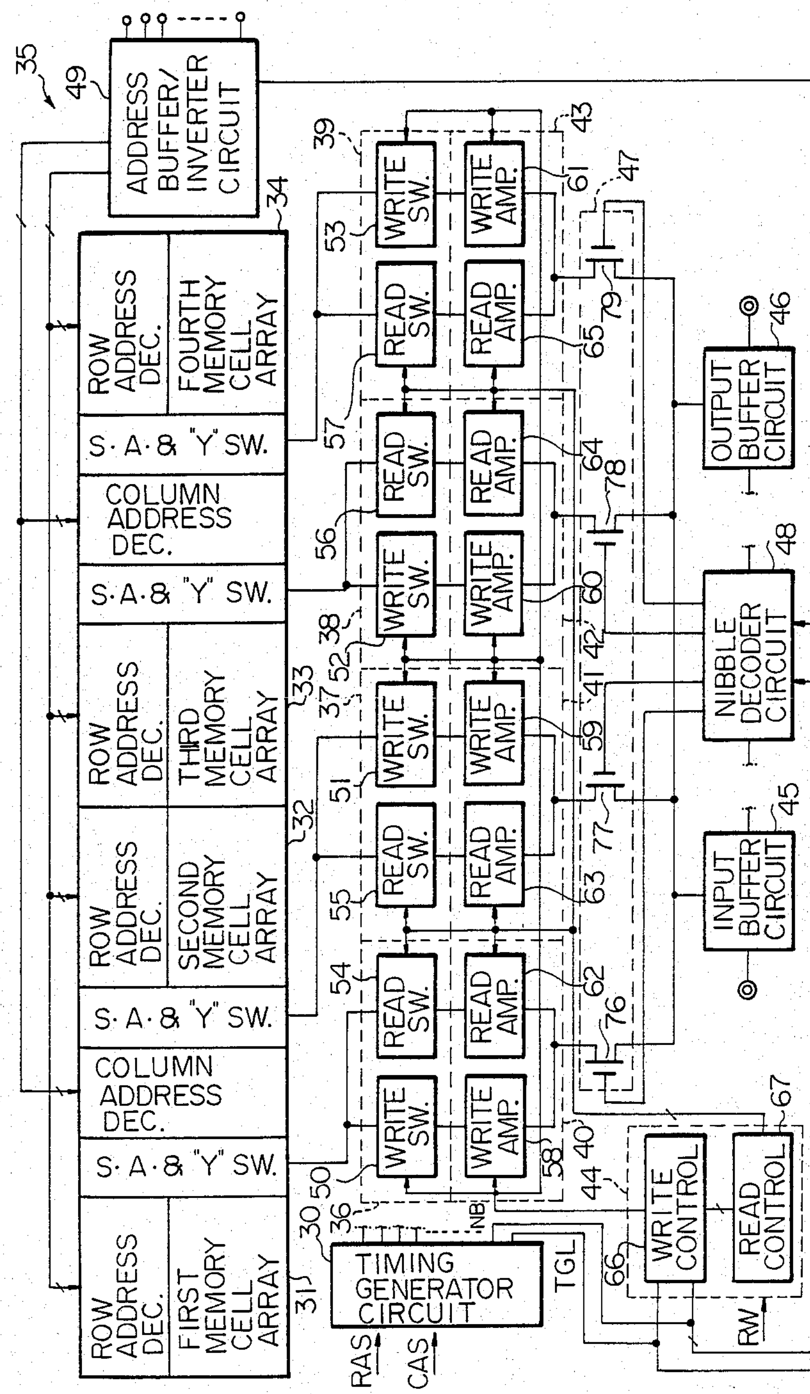
FIG. 3 is a block diagram showing the circuit arrangement of a random access memory device embodying the present invention.

Referring now to FIG. 3 of the drawings, there is shown the circuit arrangement of a random access memory device embodying the present invention. The random access memory device illustrated in FIG. 3 largely comprises timing generator circuit 30 operative to produce a plurality of internal control signals including a toggle operation control signal TGL and a nibble operation control signal NB, first, second, third and fourth memory cell arrays 31, 32, 33 and 34 each having a plurality of memory cells arranged in rows and columns, an addressing module 35, first, second, third and fourth read/write switching circuits 36, 37, 38 and 39 associated with the first to fourth memory cell arrays 31 to 34, respectively, first, second third and fourth data amplifier circuits 40, 41, 42 and 43 coupled to the first to fourth read/write switching circuits 36 to 39, respectively, a read/write control circuit 44 operative to activate the read/write switching circuits 36 to 39 and, accordingly, the data amplifier circuits 40 to 43, a data input buffer circuit 45 supplied from the outside thereof with a new data bit in a writein mode operation, a data output buffer circuit 46 operative to successively transfer four data bits preserved in four accessed memory cells to a destination in a read-out mode operation, a nibble switch circuit 47 operative to electrically couple one of the data amplifier circuits 40 to 43 to the data input buffer circuit 45 or the data output buffer circuit 46, and a nibble decoder circuit 48 operative to allow the nibble switch circuit 47 to establish the electrical path between one of the data amplifier circuits 40 to 43 and the data input buffer circuit 45 or the data output buffer circuit 46. The nibble operation signal NB is shifted between a high voltage level and a low voltage level for representing a random access stage (which is hereinunder referred to as "RAS/CAS stage") and a nibble stage of a single read-in or write-out mode operation. On the other hand, the toggle operation control signal TGL is produced in synchronous with a column address strobe signal CAS and is supplied to the nibble decoder circuit 48 for serial read-out operation or CAS toggle operation.

The addressing module comprises an address buffer/inverter circuit 49 operative to produce internal address signals and a bit control signal BC based on row and column address signals supplied from the outside thereof, row and column address decoder circuits associated with the memory cell arrays 31 to 34, and sense amplifier circuits combined with "Y" switch circuits, respectively. The internal address signals are related to one another in the manner described in the background of the invention for selecting one memory cell from each of the first, second, third and fourth memory cell arrays 31, 32, 33 and 34, and the bit control signal BC consists of four bits. In detail, the two bits of the bit control signal BC are identical in logic level with the most significant bits of the row and column address signals, respectively, and the other two bits of the bit control signal BC are opposite in logic level to the most significant bits, i.e., the inverses of the most significant bits. A row address strobe signal (RAS) and the column address strobe signal (CAS) are supplied to the timing generator circuit 30, and the address buffer/inverter circuit 49 latches the row address signal and the column address signal in synchronous with the internal control signals fed from the internal control circuit 30, respectively. However, those component circuits of the addressing module 35 are well known in the art, and, for this reason, no further description is incorporated.

Each of the first, second, third and fourth read/write switching circuits 36, 37, 38 and 39 is provided with write-in switch 50, 51, 52 or 53 and a read-out switch 54, 55, 56 or 57, and each of the first, second, third and fourth data amplifier circuits 40, 41, 42 and 43 has a write data amplifier 58, 59, 60 or 61 coupled to the write-in switch 50, 51, 52 or 53 and a read data amplifier 62, 63, 64 or 65 electrically connected to the read-out switch 54, 55, 56 or 57. The write-in switches 50 to 53 and, accordingly, the write data amplifiers 58 to 61 are selectively activated by a first activation signal produced by the read/write control circuit 44, and, on the other hand, the read-out switches 54 to 57 and the read data amplifiers 62 to 65 are selectively shifted from inactive states to active states depending upon a second activation signal fed from the read/write control circuit 44.

Figure 4:
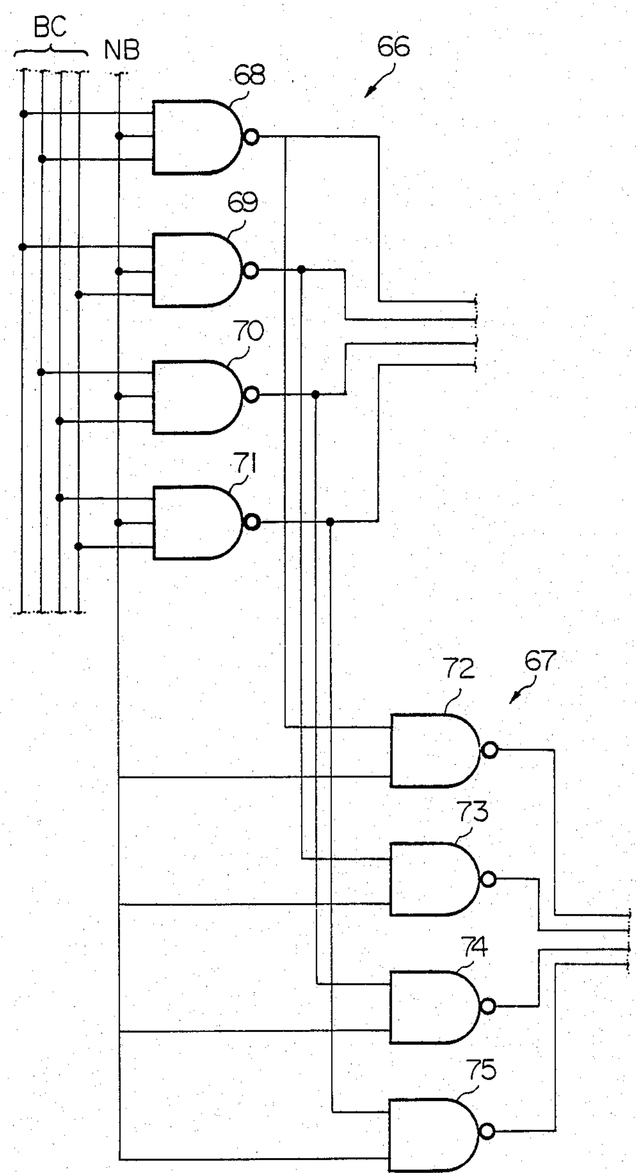
FIG. 4 is a logic diagram showing the circuit arrangement of the read/write control circuit of the random access memory device illustrated in FIG. 3.
Figure 5:
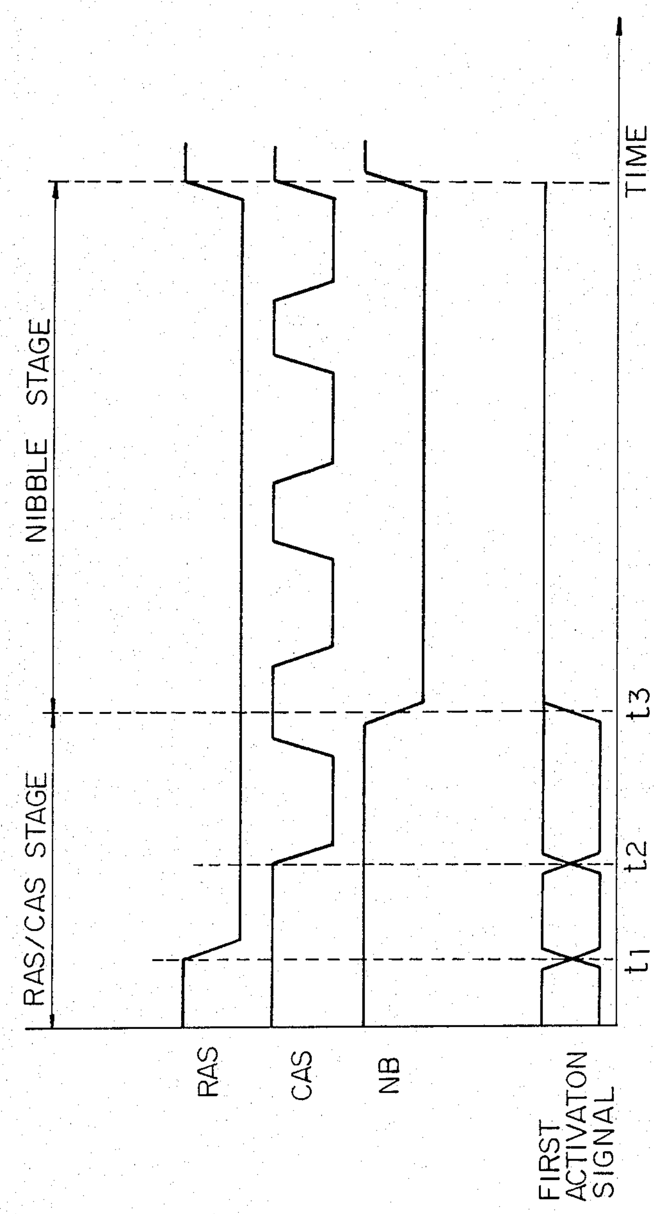
FIG. 5 is a diagram showing waveforms of essential signals related to the write-in mode operation of the random access memory device illustrated in FIG. 3.

The read/write control circuit 44 is provided with a write control circuit 66 and a read control circuit 67 which are used for the write-in mode operation and the read-out mode operation selectively carried out depending upon a write enable signal fed from the outside thereof, and the circuit arrangement thereof is illustrated in FIG. 4. The write control circuit 66 comprises four NAND gates 68, 69, 70 and 71 each having three input nodes, and one of the three input nodes is supplied with the nibble operation control signal NB. However, the remaining two input nodes are supplied with two bits of the bit control signal BC fed from the address buffer/inverter circuit 49. Namely, the NAND gate 68 is supplied with the two bits of the bit control signal BC identical in logic level with the most significant bits of the row and column address signals, and the NAND gate 69 is supplied with the two bits of the bit control signal BC one of which is identical in logic level with the most significant bit of the row address signal and the other of which is opposite in logic level to the most significant bit of the column address signal. However, the NAND gate 70 is supplied with the two bits of the bit control signal BC one of which is opposite in logic level to the most significant bit of the row address signal and the other of which is identical in logic level with the most significant bit of the column address signal, and the NAND gate 71 is supplied with the two bits of the bit control signal BC both opposite in logic level to the most significant bits of the row and column address signals, respectively. The write control circuit 66 thus arranged is operative to produce the first activation signal with four bits, and the first activation signal is supplied to the first to fourth read/write switching circuits 36 to 39 as well as the first to fourth data amplifier circuits 40 to 43 so as to activate the write-in switches 50, 51, 52 and 53 and write data amplifiers 58, 59, 60 and 61. In detail, the NAND gate 68 produces the first bit of the first activation signal for the write switch 50 and the write amplifier 58, and the NAND gate 69 produces the second bit of the first activation signal for the write switch 51 and the write amplifier 59. In a similar manner, the NAND gate 70 produces the third bit of the first activation signal for the write switch 52 and the write amplifier 60, and the NAND gate 71 produces the fourth bit of the first activation signal for the write switch 53 and the write amplifier 61. Namely, in the initial stage of the write-in mode operation or the read-out mode operation , i.e., a RAS/CAS stage, a row address signal and a column address signal are latched in succession by the address buffer/inverter circuit 49 at times t1 and t2, respectively, in synchronous with respective transitions of the row address strobe signal RAS and the column address signal CAS as will be seen from FIG. 5 of the drawings. In the RAS/CAS stage, the timing generator circuit 30 allows the nibble operation control signal NB to be in the inactive high voltage level, so that one of the NAND gates 68 to 71 is responsive to the bit control signal BC to produce the bit of high logic level of the first activation signal which selectively activates one of the data write amplifiers 76, 77, 78 and 79 and, accordingly, one of the write switches 72, 73, 74 and 75 for random access operation. Upon completion of the RAS/CAS stage, a nibble stage follows. In the nibble stage of the write-in mode operation or the read-out mode operation, the nibble operation control signal NB goes down to the active low voltage level at time t3 in FIG. 5, so that all of the NAND gates 68 to 71 produce the bits of the high logic levels, thereby causing all of the write-in switches 50 to 53 and all of the write data amplifiers 58 to 61 to be activated for simultaneous four bit write-in operation.

Similarly, the read control circuit 67 comprises four NAND gates 72, 73, 74 and 75 each having two input nodes, and the NAND gates 72 to 75 are supplied in parallel with the respective bits of the first activation signal and the nibble operation control signal NB to produce the second activation signal consisting of four bits. In detail, the NAND gate 72 produces the first bit of the second activation signal for the read switch 54 and the read amplifier 62, and the NAND gate 73 produces the second bit of the second activation signal for the read switch 55 and the read amplifier 63. In a similar manner, the NAND gate 74 produces the third bit of the second activation signal for the read switch 56 and the read amplifier 64, and the NAND gate 75 produces the fourth bit of the second activation signal for the read switch 57 and the read amplifier 65. Namely, when the random access memory device is supplied with the row address strobe signal RAS and the column address strobe signal CAS accompanied by row and column address signals, respectively, for the read-out mode operation or the write-in mode operation, the operation starts with the RAS/CAS stage followed by the nibble stage. In the RAS/CAS stage, the timing generator circuit 30 shifts the nibble operation control signal NB to the inactive high voltage level, so that all bits of the second activation signal are opposite in logic level to all bits of the first activation signal, respectively, thereby allowing three of the read-out switches and three of the read data amplifiers to be activated. However, upon completion of the RAS/CAS stage, the nibble operation control signal NB goes down to the active low voltage level, so that all bits of the second activation signal has the high logic levels, respectively, then allowing all of the read-out switches 54 to 57 and, accordingly, all of the read data amplifiers 62 to 65 to be simultaneously activated for the four bit read-out operation.

The nibble switch circuit 47 has four switching transistors 76, 77, 78 and 79, and the switching transistors 76 to 79 are capable of providing respective conduction paths between the first, second, third and fourth data amplifier circuits 40 to 43 and the data input buffer circuit 45 or the data output buffer circuit 46 under the control of the nibble decoder circuit 48 on the basis of the bit control signal BC. However, the nibble decoder circuit does not control the read/write switching circuits 36, 37, 38 and 39 and, accordingly, the data amplifier circuits 40, 41, 42 and 43, so that the random access memory device according to the present invention is improved in controllability and is simplified in arrangement of the control lines.

In operation, when an external processing unit accesses four memory cells for reading out the four data bits preserved therein, the write enable signal of the high voltage level and the row address strobe signal RAS of the low voltage level accompanied by a row address signal are supplied from the processing unit to the respective terminals of the random access memory device. The processing unit further supplies the column strobe signal CAS accompanied by a column address signal to the terminals of the random access memory device, then the random access memory device starts a read-out mode operation. Assuming now that the row and column address signals specifies a certain memory cell of the first memory cell array 31, the address buffer/inverter circuit 49 produces the internal address signals which are provided to the row and column address decoder circuits, so that the four data bits are read out from the certain memory cell and the related memory cells of the second, third and fourth memory cell arrays 32, 33 and 34 in response to the internal address signals. As described hereinbefore, the address buffer/inverter circuit 49 further produces the bit control signal BC which is supplied to not only the nibble decoder circuit 48 but also the read/write control circuit 44. In the RAS/CAS stage of the read-out mode operation, the timing generator circuit 30 shifts the nibble operation control signal NB to the inactive high voltage level, so that the write control circuit 66 produces the first activation signal with one high level bit specified by the bit control signal BC. However, when the RAS/CAS stage is finished, the timing generator circuit 30 shifts the nibble operation signal NB from the inactive high voltage level to the active low voltage level. Then, the write control circuit 66 shifts all bits of the first activation signal to the high logic levels, respectively, and, accordingly the read control circuit 67 produces the second activation signal with the four bits each having the high logic level regardless of the bit control signal BC. The nibble decoder circuit 48 is also supplied with the bit control signal BC from the address buffer/inverter circuit 49 and successively allows the switching transistors 76, 77, 78 and 79 to turn on in response to the toggle operation control signals TGL successively fed from the timing generator circuit 30. Namely, the nibble decoder circuit 48 firstly activates the switching transistor 76 to transfer the data bit preserved in the certain memory cell from the read data amplifier 62 to the data output buffer circuit 46, and, thereafter, activates the switching transistors 77, 78 and 79 in a predetermined order in synchronous with the column address strobe signal CAS, thereby performing the serial read-out operation.

Description is hereinunder focused on the write-in mode operation with the assumption that the row and column address signals specifies the same memory cell as that accessed in the read-out mode operation. In the RAS/CAS stage of the write-in mode operation, the timing generator circuit 30 shifts the nibble operation control signal NB to the inactive high voltage level, so that the write control circuit 67 produces the first activation signal which allows the write-in switch 50 and the write data amplifier 58 to be activated but keeps the write-in switches 51, 52 and 53 and the write data amplifiers 59, 60 and 61 in the respective inactive states. However, the road control circuit 67 produces the second activation signal with the four bits opposite in logic level to the four bits of the first activation signal, so that the read-out switches 55, 56 and 57 and the read data amplifiers 59, 60 and 61 are activated in the presence of the second activation signal, but the read-out switch 54 and the read data amplifier 62 keep the inactive states. On the other hand, the nibble decoder circuit 48 allows the switching transistor 76 to turn on in response to the bit control signal BC, however the other switching transistors 77, 78 and 79 are turned off. In this situation, a new data bit appears at the data input buffer circuit 45, the switching transistor 76 transfers the new data bit from the data input buffer circuit 45 to the write data amplifier 58 which in turn transfers the new data but to the write-in switch 50 after amplification. As the switching transistors 77, 78 and 79 are turned off, so that the new data nit does not supplied to the write data amplifiers 59, 60 and 61. However, in the RAS/CAS stage, the read-out switches 55, 56 and 57 and the read data amplifiers 63, 64 and 65 are activated by the read control circuit 67. Then, the data bits preserved in the memory cells of the second, third and fourth memory cell arrays 32, 33 and 34 are supplied to the write data amplifiers 59, 60 and 61 through the read-out switches 55, 56, and 57 and, accordingly, the read data amplifiers 63, 64 and 65, respectively. When the random access memory device proceeds to the nibble stage after completion of the RAS/CAS stage, the timing generator circuit 30 shifts the nibble operation control signal NB from the inactive high voltage level to the active low voltage level, then the write control circuit 66 produces the first activation signal with four bits each in the high level regardless of the bit control signal BC. With the first activation signal, all of the write data amplifiers 58, 59, 60 and 61 and all of the write-in switches 50, 51, 52 and 53 are activated, and the new data bit and the three data bits read out from the second, third and fourth memory cell arrays 32, 33 and 34 are respectively transferred to the first, second, third and fourth memory cell arrays 31, 32, 33 and 34 through the addressing module. The random access memory device thus arranged rewrites the data bits which have been preserved in the memory cell arrays except for the memory cell array having the certain memory cell specified by the row and column address signals, so that the data bits are not destroyed in the write-in mode operation.

In the embodiment described above, the random access memory device has the nibble decoder circuit serving as a four-to-one decoder circuit, however, the present invention is applicable to a random access memory device with double data amplifier circuits in an interleave manner or with four data output buffer circuits. Moreover, the present invention is applicable to a random access memory device with a serial data access operation in which more than four bits are read-out in succession at a single read-out mode operation.

Although particular embodiment of the present invention have been shown and described, it will be obvious to those skilled in the art that various changes and modifications may be made without departing from the spirit and scope of the present invention.

What is claimed is:

1. A random access memory device with a read-out mode operation and a write-in mode operation, said write-in mode operation having a random access stage followed by a simultaneous access stage, comprising:

(a) plural memory cell arrays each having a plurality of memory cells arranged in rows and columns;

(b) addressing means operative to produce a bit control signal and internal address signals specifying certain memory cells each selected from each memory cell array for said read-out mode operation and said write-in mode operation, one of said certain memory cells being directly specified by a row address signal and a column address signal supplied from an external source;

(c) plural read/write switching circuits associated with said plural memory cell arrays, respectively, each of said read/write switching circuits being provided with a write-in switch and a read-out switch which are capable of electrically connecting each of said certain memory cells through said addressing means;

(d) plural data amplifier circuits paired with said read/write switching circuits, respectively, each of said data amplifier circuits being provided with a write data amplifier and a read data amplifier which are coupled to said write-in switch and said read-out switch, respectively;

(e) a data input buffer circuit supplied with a new data bit from said external source;

(f) a data output buffer circuit operative to transfer data bits preserved in said certain memory cells to an external destination in sequence;

(g) switching means provided with plural switching transistors having respective conduction paths coupled at one ends thereof to said data amplifier circuits, respectively, and at the other ends thereof to said data input buffer circuit or said data output buffer circuit;

(h) a data control circuit responsive to said bit control signal and operative to cause one of said switching transistors to turn on in said write-in mode operation, said data control circuit being further operative to cause said switching transistors to successively turn on in said read-out mode operation; and (i) a read/write control circuit operative to produce first and second activation signals the former of which is supplied to said write-in switches and said write data amplifiers for activation and the latter of which is supplied to said read-out switches and said read data amplifiers, said first activation signal allowing said write-in switch of one of said read/write switching circuit and said write data amplifier of one of said data amplifier circuits to transfer said new data bit to said memory cell directly specified by said row and column address signals in said random access stage, said second activation signal allowing said read-out switches of said read/write switching circuits except for said one of said read/write switching circuits and said read data amplifiers of said data amplifier circuits except for said one of said data amplifier circuits to read out said data bits from said certain memory cells except for said certain memory cell directly specified by said row and column address signals in said random access stage, said first activation signal allowing all of said write-in switches and all of said write data amplifiers to write said new data bit and said data bits into certain memory cells.

2. A random access memory device as set forth in claim 1, in which said random access memory device further comprises a control circuit operative to produce a stage control signal representative of said random access state or said simultaneous access stage.

3. A random access memory device as set forth in claim 2, in which said read/write control circuit has a write control circuit supplied with said bit control signal and said stage control signal for producing said first activation signal and a read control circuit supplied with said first activation signal and said stage control signal for producing said second activation signal.

4. A random access memory device as set forth in claim 3, in which said write control circuit has a plurality of NAND gates each supplied with a part of said bit control signal and said stage control signal.

5. A random access memory device as set forth in claim 4, in which said read control signal has a plurality of NAND gates each supplied with a part of said first activation signal and said stage control signal.

6. A random access memory device as set forth in claim 5, in which said bit control signal consists of a plurality of bits including two bits identical in logic level with the most significant bits of said row and column address signals, respectively, and two bits opposite in logic level to the most significant bits of said row and column address signals, respectively.

7. A random access memory device with a read-out mode operation and a write-in mode operation, said write-in mode operation having a random access stage followed by a simultaneous access stage, comprising:

(a) plural memory cell arrays each having a plurality of memory cells arranged in rows and columns;

(b) addressing means operative to produce a bit control signal and internal address signals specifying certain memory cells each selected from each memory cell array for said read-out mode operation and said write-in mode operation, one of said certain memory cells being directly specified by a row address signal and a column address signal latched in synchronous with a row address stobe signal and a column address strobe signal, respectively, said bit control signal having four bits two of which are identical in logic level to the most significant bits of said row and column address signals, respectively, and the others of which are opposite in logic level to the most significant bits of said row and column address signals, respectively;

(c) plural read/write switching circuits associated with said plural memory cell arrays, respectively, each of said read/write switching circuits being provided with a write-in switch and a read-out switch which are capable of electrically connecting each of said certain memory cells through said addressing means;

(d) plural data amplifier circuits paired with said read/write switching circuits, respectively, each of said data amplifier circuits being provided with a write data amplifier and a read data amplifier which are coupled to said write-in switch and said read-out switch, respectively;

(e) a data input buffer circuit supplied with a new data bit from the external source in said write-in mode operation;

(f) a data output buffer circuit operative to transfer data bits preserved in said certain memory cells to an external destination in sequence in said read-out mode operation;

(g) switching means provided with plural switching transistors having respective conduction paths coupled at one ends thereof to said data amplifier circuits, respectively, and at the other ends thereof to said data input buffer circuit or said data output buffer circuit;

(h) a data control circuit responsive to said bit control signal and operative to cause one of said switching transistors to turn on in said write-in mode operation, said data control circuit being further operative to cause said switching transistors to successively turn on in synchronous with said column address strobe signals in said read-out mode operation;

(i) a timing generator circuit operative to produce a plurality of internal control signals including a stage control signal, said stage control signal being in a high level in said random access state and in a low level in said simultaneous access stage; and (j) a read/write control circuit provide with a write control circuit and a read control circuit, in which said write control circuit has a plurality of NAND gates each supplied with two bits of said bit control signals and said stage control signal for producing a first activation signal and the stage control signal for producing a second activation signal with a plurality of bits each supplied to each of said write-in switches and each of said write data amplifiers and in which said read control circuit has a plurality of NAND gates each supplied with one of the plural bits of said first activation signal with a plurality of bits each supplied to each of said read-out switches and each of said read data amplifiers, thereby allowing said write-in switch of one of said read/write switching circuit and said write data amplifier of one of said data amplifier circuits to transfer said new data bit to said memory cell directly specified by said row and column address signals in said random access stage, said second activation signal allowing said read-out switches of said read/write switching circuits except for said one of said read/write switching circuits and said read data amplifiers of said data amplifier circuits except for said one of said data amplifier circuits to read out said data bits from said certain memory cells except for said certain memory cell directly specified by said row and column address signals in said random access stage, said first activation signal allowing all of said write-in switches and all of said write data amplifiers to write said new data bit and said new data bits into certain memory cells.

* * * * *

UNITED STATES PATENT AND TRADEMARK OFFICE
CERTIFICATE OF CORRECTION

PATENT NO. : 4,875,189

DATED : October 17, 1989

INVENTOR(S) : Takashi Obara

It is certified that error appears in the above-identified patent and that said Letters Patent is hereby corrected as shown below:

Column 10, line 9, delete "nit", and insert --bit--.

Column 13, lines 11 and 12, delete "and the stage control signal for producing a second activation signal".

Column 13, line 17, after "signal" should read --and the stage control signal for producing a second activation signal--.

Signed and Sealed this

Nineteenth Day of February, 1991

*Attest:*

HARRY F. MANBECK, JR.

*Attesting Officer*

*Commissioner of Patents and Trademarks*